United States Patent
Uehara et al.

(10) Patent No.: US 6,815,284 B2
(45) Date of Patent: Nov. 9, 2004

(54) MANUFACTURING METHOD OF SEMICONDUCTOR DEVICE

(75) Inventors: Masafumi Uehara, Oizumi-Machi (JP); Shuichi Kikuchi, Oizumi-Machi (JP); Masaaki Momen, Ojiya (JP)

(73) Assignees: Sanyo Electric Co., Ltd., Osaka (JP); Niigata Sanyo Electronics Co., Ltd., Niigata (JP)

( * ) Notice: Subject to any disclaimer, the term of this patent is extended or adjusted under 35 U.S.C. 154(b) by 0 days.

(21) Appl. No.: 10/305,394

(22) Filed: Nov. 27, 2002

(65) Prior Publication Data

US 2003/0153154 A1 Aug. 14, 2003

(30) Foreign Application Priority Data

Nov. 30, 2001 (JP) ........................................ 2001-367259

(51) Int. Cl.[7] ............................................ H01L 21/8238
(52) U.S. Cl. ................................................... 438/231
(58) Field of Search ........................ 438/142, 197–210, 438/217, 218, 224, 229, 231, 232, 247, 251, 275, 223, 225, 227, 228, 514, 521, 527, 546–549

(56) References Cited

U.S. PATENT DOCUMENTS

| | | | | |
|---|---|---|---|---|
| 4,717,686 A | * | 1/1988 | Jacobs et al. | 438/207 |
| 4,855,245 A | * | 8/1989 | Neppl et al. | 438/207 |
| 4,866,002 A | * | 9/1989 | Shizukuishi et al. | 438/217 |
| 5,486,486 A | * | 1/1996 | Ghezzi et al. | 438/201 |
| 5,498,577 A | * | 3/1996 | Fulford et al. | 438/703 |
| 5,597,753 A | * | 1/1997 | Sheu et al. | 438/275 |
| 5,776,807 A | * | 7/1998 | Ronkainen et al. | 438/202 |
| 5,933,731 A | * | 8/1999 | Tanimoto et al. | 438/258 |
| 6,008,524 A | * | 12/1999 | Gomi | 257/575 |
| 6,235,590 B1 | * | 5/2001 | Daniel et al. | 438/275 |
| 6,559,504 B2 | * | 5/2003 | Nishibe et al. | 257/343 |
| 6,599,782 B1 | * | 7/2003 | Kikuchi et al. | 438/147 |
| 6,608,336 B2 | * | 8/2003 | Kikuchi et al. | 257/288 |

* cited by examiner

*Primary Examiner*—George Fourson
*Assistant Examiner*—Brook Kebede
(74) *Attorney, Agent, or Firm*—Morrison & Foerster LLP

(57) ABSTRACT

A manufacturing method of this invention has an ion-implantation process for threshold voltage adjustment of an MOS transistor, including a process to form a first well of an opposite conductivity type in a substrate of one conductivity type, to form a second well of the opposite conductivity type having higher impurity concentration than that in the first well, under a region where a thin gate insulation film is formed, to form gate insulation films on the first well and the second well, each having a different thickness, to ion-implant first impurities of the one conductivity type into the wells of the opposite conductivity type under the condition that the impurities penetrate the gate insulation films of different thicknesses and to ion-implant second impurities of the one conductivity type into the second well of the opposite conductivity type under the condition that the second impurities penetrate the thin gate insulation film but do not penetrate the thick gate insulation film. Thus the ion-implantation process for the threshold voltage adjustment of a semiconductor device having gate insulation films of different thicknesses can be rationalized with this invention.

8 Claims, 8 Drawing Sheets

MANUFACTURING METHOD OF SEMICONDUCTOR DEVICE

BACKGROUND OF THE INVENTION

1. Field of the Invention

This invention relates to a manufacturing method of a semiconductor device, specifically to an ion-implantation technology to control a threshold voltage of a high voltage MOS (Metal Oxide Semiconductor) transistor used for various drivers such as an LCD driver, especially a gate driver using a TFT (Thin Film Transistor).

2. Description of the Related Art

Manufacturing method of a semiconductor device according to a conventional art will be explained hereinafter referring to FIGS. 12 and 13.

FIG. 12 is a cross-sectional view of a high voltage P channel open drain MOS transistor.

As shown in FIG. 12, an N-type well region (NW) 52 is formed in a P type semiconductor substrate (P-sub) 51, on which a first gate insulation film 53A and a second gate insulation film 53B, each having a different thickness from each other, are formed. A selective oxidation film 53C is formed in the same process step as an element isolation film 53D. A gate electrode 54 is formed over the first and the second gate insulation films 53A and 53B and the selective oxidation film 53C.

A P+ type source region 55 is formed adjacent one end of the gate electrode 54 and a P− type drain region 57 is formed facing the source region 55 with a channel region 56 between them. Also, a P+ type drain region 58 is formed away from the other end of the gate electrode 54 and surrounded by the P− type drain region 57.

Then, an interlayer insulation film 59 is formed on the entire surface followed by a formation of a metal interconnect 60 which contacts with the source and the drain regions 55 and 58, respectively, through contact holes formed in the interlayer insulation film 59.

As described above, the high voltage MOS transistor has the first gate insulation film 53A and the second gate insulation film 53B, each having the different thickness from each other.

There has been a problem as described below in an ion-implantation process to adjust a threshold voltage of the high voltage MOS transistor of such a structure.

When implanting ions under the first and the second gate insulation films 53A and 53B to adjust the threshold voltage, the ion-implantation for the threshold voltage adjustment is performed after a conductive film 54A for forming the gate electrode is formed on the gate insulation films 53A and 53B, as shown in FIG. 13.

When the ions for the threshold voltage adjustment are implanted in a single ion-implantation process step under both of the first and the second gate insulation films 53A and 53B, each having the different thickness from each other, an impurity concentration profile in a region A (under the thin gate insulation film) becomes different from that in a region B (under the thick gate insulation film). The ions for the threshold voltage adjustment are not implanted into a region C under the selective oxidation film 53C.

That is, an ion-implanted layer 61A in the region A under the thin gate insulation film is deeper than an ion-implanted layer 61B in the region B under the thick gate insulation film, as shown in FIG. 13. In this case, there arises a problem that the threshold voltage in the region A is reduced compared to that in the region B, since the impurity concentration is higher and the gate insulation film is thinner in the region A than in the region B.

Therefore, it has been necessary to perform ion-implantation process steps for the threshold voltage adjustment to the region A and to the region B separately, in order to adjust the threshold voltages in the region A and in the region B. Accordingly, two photoresist masks are required in the manufacturing method of the conventional art, resulting in two individual processing steps to achieve a desirable threshold voltage in the regions A, B.

SUMMARY OF THE INVENTION

Considering the problems addressed above, a manufacturing method of this invention has process steps for threshold voltage adjustment, to provide a semiconductor substrate of one conductivity type, to form a first well of an opposite conductivity type in the substrate, to form a second well of the opposite conductivity type having higher impurity concentration than that in the first well under a region where a thin gate insulation film is formed, to form gate insulation films on the first well and the second well, each film having different thickness from each other, to ion-implant first impurities of the one conductivity type into both of the wells under conditions that the first impurity ions penetrate both of the gate insulation films of different thicknesses and to ion-implant second impurities of the one conductivity type into the second well under conditions that the second impurity ions penetrate the thin gate insulation film but do not penetrate the thick gate insulation film.

The second well of the opposite conductivity type is formed to offset the first impurities of the one conductivity type.

The thin gate insulation film is formed after the process step to form the thick gate insulation film.

Or the thin gate insulation film is formed before the process step to form the thick gate insulation film.

Furthermore, the manufacturing method of the semiconductor device of this invention includes a process step to form a selective insulation film by selective oxidation of the semiconductor substrate with a mask of an oxidation resistant film formed on the predetermined region of the semiconductor substrate, a process step to form the thick gate insulation film bordering on the selective insulation film after removing the oxidation resistant film, a process step to form the thin gate insulation film bordering on the thick gate insulation film by thermal oxidation of the substrate after removing a portion of the thick gate insulation film, a process step to form a gate electrode across the thin gate insulation film, thick gate insulation film and the selective insulation film and a process step to form a source region bordering the gate electrode through the thin gate insulation film and a drain region bordering the gate electrode through the selective insulation film.

DETAILED DESCRIPTION OF THE INVENTION

An embodiment of manufacturing method of a semiconductor device of this invention will be explained referring to the FIGS. 1–11. In this embodiment, a high voltage (about 45V, for example) P channel open drain MOS transistor is manufactured. Such a device is used for various drivers including an LCD driver, especially a gate driver using a TFT.

Figure 3:
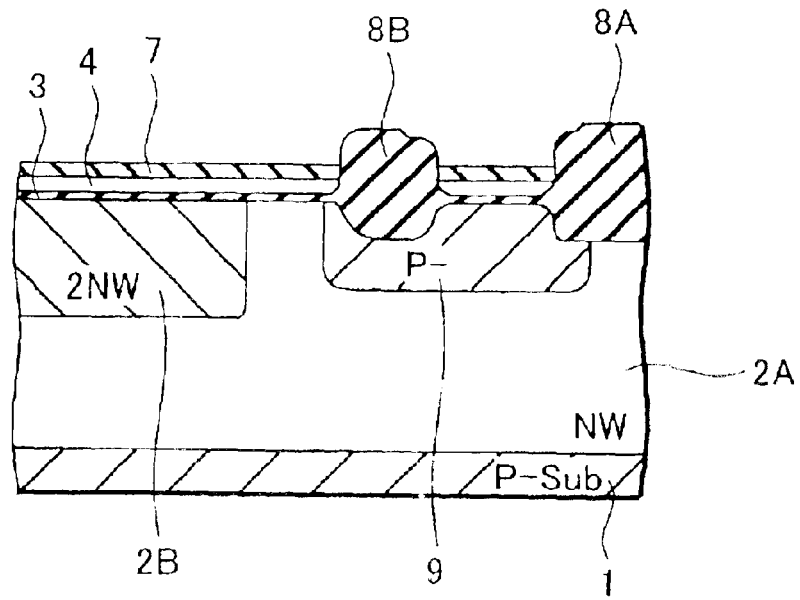
FIG. 3 is a cross-sectional view showing a device intermediate according to the manufacturing method of the semiconductor device of the embodiment of this invention.
Figure 8:
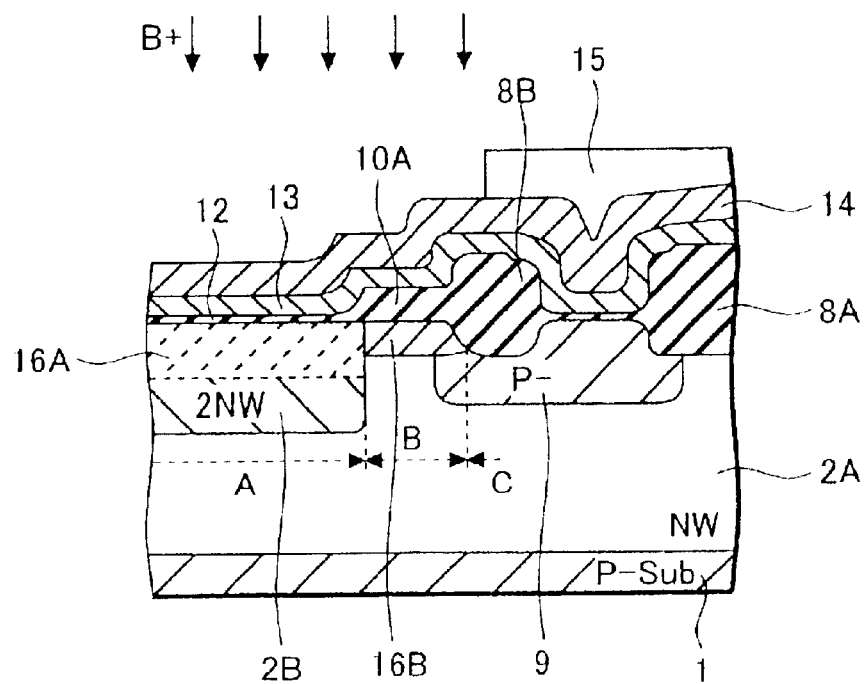
FIG. 8 is a cross-sectional view showing a device intermediate according to the manufacturing method of the semiconductor device of the embodiment of this invention.
Figure 9:
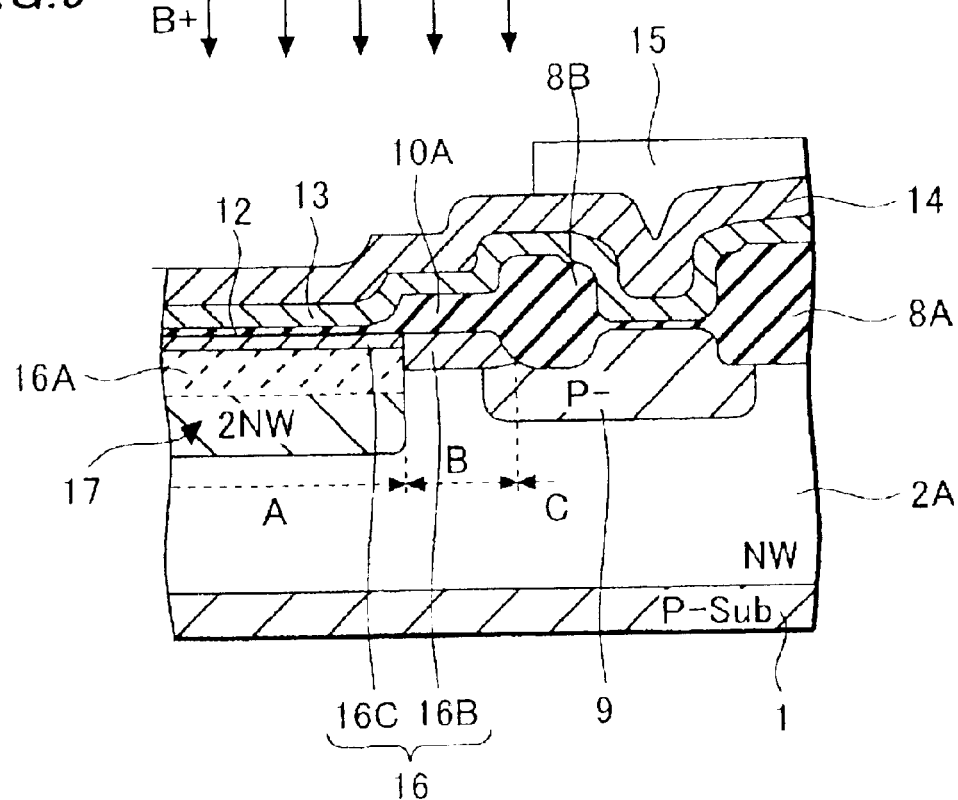
FIG. 9 is a cross-sectional view showing a device intermediate according to the manufacturing method of the semiconductor device of the embodiment of this invention.

First, processing steps characteristic to this embodiment are described with reference to the drawings, and will be described more specifically later in the context of the entire manufacturing method of this embodiment. As shown in FIG. 3, a second N type well region 2B for a normal voltage (5V, for example) P channel MOS transistor (not shown) is formed in a first N well 2A under a region where a second gate insulation film 12 is formed. As shown in FIGS. 8 and 9, after impurities (boron ions, for example) are implanted into a first and the second N type well regions 2A, 2B under a first and a second gate insulation films 10A and 12, respectively, under desired conditions to form a second ion-implanted layer 16B and a first ion-implanted layer 16A (FIG. 8), impurities (boron ions, for example) are ion-implanted into the second N type well region 2B under the second gate insulation film 12 to form a third ion-implanted layer 16C (FIG. 9).

The boron ions implanted into the second N type well region 2B are offset by phosphorous ions forming the second N type well region 2B. A P type layer (a third ion-implanted layer 16C) for threshold voltage adjustment is formed in a relatively shallow region of the substrate 1, only with boron ions implanted only into a region A under the second gate insulation film 12. Another P type layer (the second ion-implanted layer 16B) for the threshold voltage control is formed by the first ion-implantation deep into the substrate 1 in the region B under the first gate insulation film 10A.

As described above, compared with the manufacturing method of the prior art, which uses a plurality of masks in ion-implantations for the threshold voltage adjustment of the semiconductor device having gate insulation films with different thicknesses, the number of masks is reduced with this embodiment by taking advantage of the difference in the thickness of the gate insulation films. And the first boron ions in the first ion-implanted layer 16A implanted under the second gate insulation film 12 can be offset by the second N type well region 2B having higher impurity concentration than the first N-type well region 2A formed under the second gate insulation film 12 in advance, the relatively deep P type layer can be formed only under the first gate insulation film 10A and the relatively shallow P type layer (the third ion-implanted layer 16C) can be formed by the second boron ion-implantation under the second gate insulation film 12, enabling setting the threshold voltage suitable for each of the regions.

Also, because the impurity concentration in the region A (the second N type well region 2B) shown in FIG. 9 is higher than the impurity concentration in the first N type well region 2A, a depletion layer extending from drain regions 9 and 19, which will be described later, can be suppressed to reduce the size of the transistor.

The manufacturing method of this embodiment will be explained hereinafter.

Figure 1:
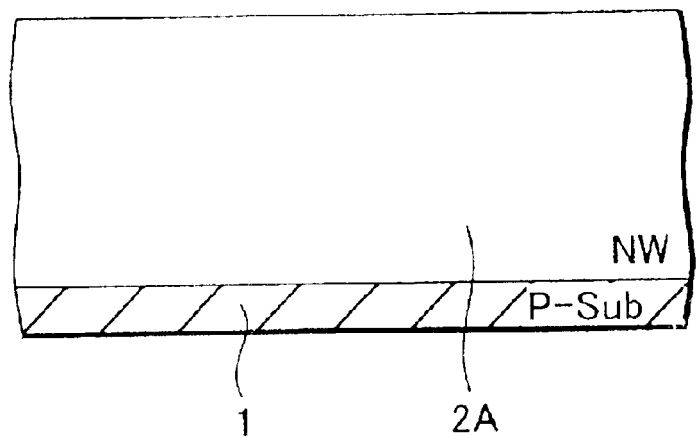
FIG. 1 is a cross-sectional view showing a device intermediate according to a manufacturing method of a semiconductor device of an embodiment of this invention.

In a semiconductor substrate 1 of one conductivity type, for example P type substrate (P-sub), a first N type well region (NW) 2A is formed, as shown in FIG. 1. The first N type well region 2A is formed by an implantation of $7 \times 10^{12}$/cm$^2$ of phosphorous ions at an acceleration voltage of 160 KeV followed by a diffusion at about 1200° C. for 8 hrs in a $N_2$ atmosphere. The impurity concentration in the first N type well region 2A is about $5 \times 10^{15}$/cm$^3$.

Figure 2:
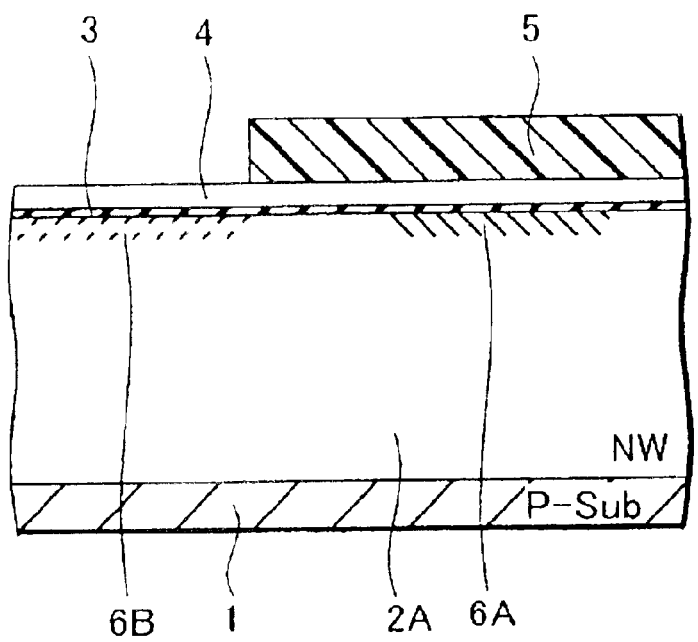
FIG. 2 is a cross-sectional view showing a device intermediate according to the manufacturing method of the semiconductor device of the embodiment of this invention.

Next, as shown in FIG. 2, about 15 nm of an insulation film 3 and about 50 nm of a polysilicon film 4 are formed on an entire surface of the substrate, and then P type impurities, e.g. $1 \times 10^{13}$/cm$^2$ of boron ions, are implanted at an acceleration voltage of 160 KeV with a mask of photoresist film (not shown) formed on the polysilicon film 4. With this, a first high impurity layer 6A is formed in a region to make the drain of the high voltage P channel open drain MOS transistor. After the photoresist film is removed, N type impurities, e.g. $7 \times 10^{12}$/cm$^2$ of phosphorous ions, are implanted at an acceleration voltage of 160 KeV with a mask of photoresist film 5 formed on the polysilicon film 4, to form a second high impurity layer 6B. The insulation film 3 and the polysilicon film 4 are so-called pad oxide film and pad polysilicon film for the LOCOS insulation film formation, which will be described later.

Next as shown in FIG. 3, an element isolation film 8A and an selective insulation film 8B, both made of the LOCOS insulation film, are formed by a selective oxidation of the substrate 1 with a mask of a silicon nitride film 7 formed on the polysilicon film 4. The impurities in the high impurity layers 6A and 6B are diffused to form a low impurity concentration drain region (P– layer) 9 and the second N type well region 2B, respectively, during the selective oxidation. The LOCOS insulation film may also be formed using only the pad oxide film, rather than using both the pad polysilicon film and the pad oxide film.

Figure 4:
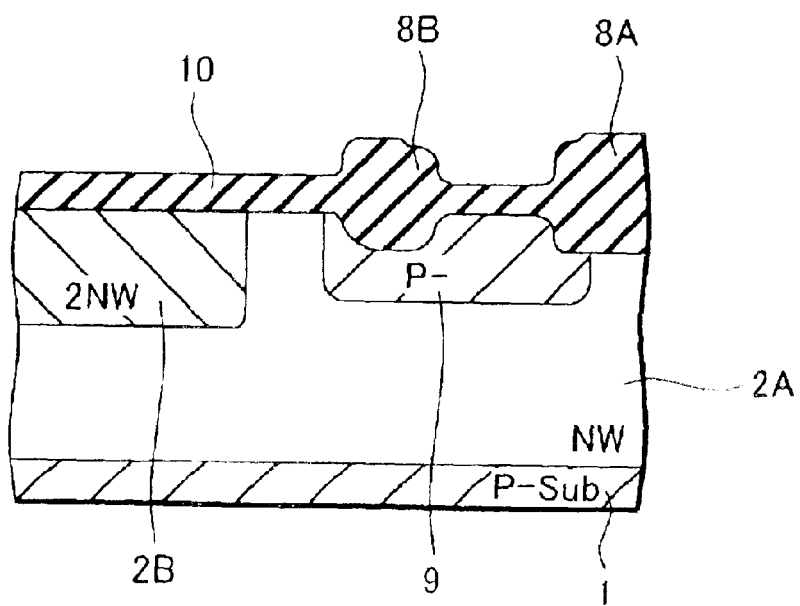
FIG. 4 is a cross-sectional view showing a device intermediate according to the manufacturing method of the semiconductor device of the embodiment of this invention.

Then about 120 nm of thick gate insulation film 10 (the first gate insulation film) is formed by a pyrolytic oxidation of the surface of the substrate at about 850° C., as shown in FIG. 4.

Figure 5:
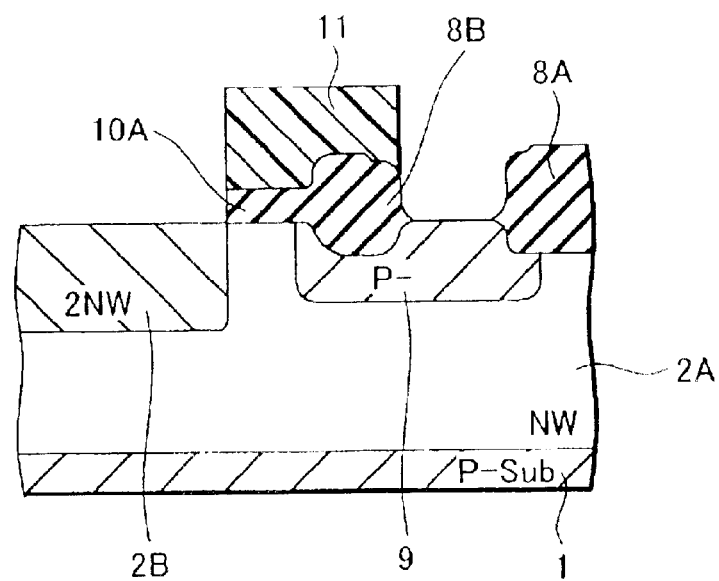
FIG. 5 is a cross-sectional view showing a device intermediate according to the manufacturing method of the semiconductor device of the embodiment of this invention.

As shown in FIG. 5, a photoresist film 11 is formed on the selective insulation film 8B and a part of the thick gate insulation film 10. Then the other part of the insulation film 10, which is not covered by the photoresist film 11, is removed, leaving thick gate insulation film 10A adjacent the selective insulation film 8B.

Figure 6:
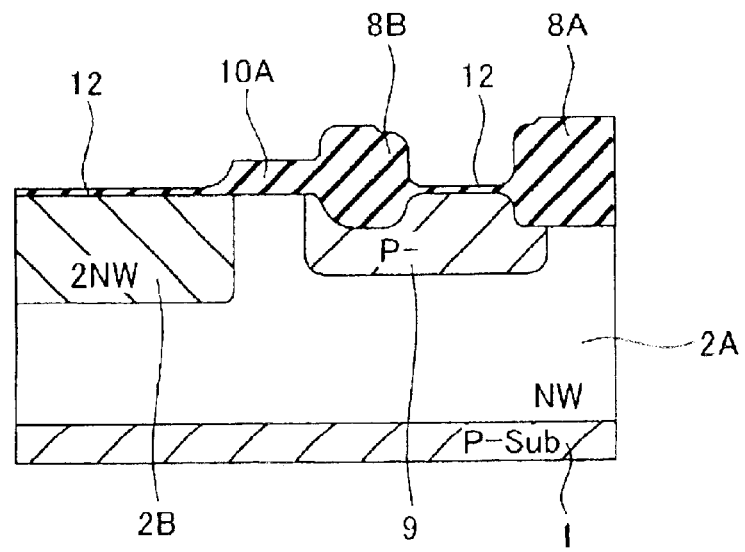
FIG. 6 is a cross-sectional view showing a device intermediate according to the manufacturing method of the semiconductor device of the embodiment of this invention.

And as shown in FIG. 6, the thin gate insulation film 12 (the second gate insulation film) of 15 nm in thickness is formed adjacent the thick gate insulation film 10A, by a pyrolytic oxidation of the substrate at about 850° C. followed by a thermal treatment at 900° C. in a nitrogen atmosphere for 10 min, after removing the photoresist film 11. The thickness of the first gate insulation film 10A in some degree increases during this processing, because the surface of the substrate under the first gate insulation film 10A is oxidized.

Figure 7:
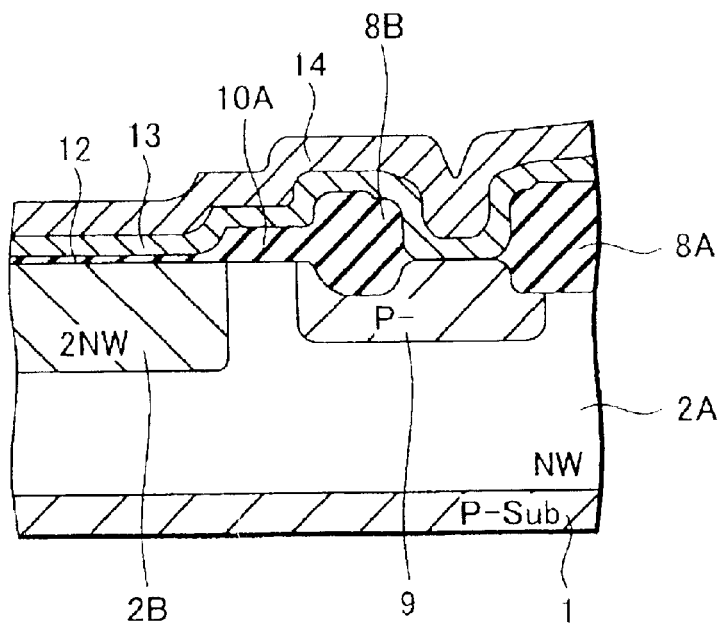
FIG. 7 is a cross-sectional view showing a device intermediate according to the manufacturing method of the semiconductor device of the embodiment of this invention.

As shown in FIG. 7, a phosphorous-doped polysilicon film 13 having a thickness of about 100 nm and then a silicide film (tungsten silicide (WSix) film in this embodiment) having a thickness of about 150 nm are formed on the entire surface of the substrate to form a conductive film for a gate electrode. The conductive film for the gate electrode may be a single layer film consisting of polysilicon only.

As shown in FIG. 8, impurities are implanted into a portion under the region to form a gate electrode (under the thick gate insulation film 10A and the thin gate insulation film 12) with a mask of photoresist film 15. In this process, by implanting P type impurities, e.g. $7 \times 10^{11}/cm^2$ of boron ions at an acceleration voltage of 70 KeV, the first ion-implanted layer (a deep ion-implanted layer) 16A is formed under the thin gate insulation film 12 as well as the second ion-implanted layer (a shallow ion-implanted layer) 16B is formed under the thick gate insulation film 10A. Since impurities of the first ion-implanted layer 16A (boron ions) are offset by the impurities of the N type well region 2B (phosphorous ions), net impurities in the region is N type.

As shown in FIG. 9, impurities are again implanted into the portion under the region to form the gate electrode (under the thin gate insulation film 12) with the mask of photoresist film 15. In this process, by implanting P type impurities, e.g. $2.25 \times 10^{12}/cm^2$ of boron ions at an acceleration voltage of 20 KeV, the third ion-implanted layer 16C is formed in relatively shallow region (close to the surface) of the substrate 1 under the thin gate insulation film 12.

With this, an ion-implanted layer 16 for the threshold voltage adjustment consisting of the second ion-implanted layer 16B (a P type layer) and the third ion-implanted layer 16C (a P type layer) is formed under the first gate insulation film 10A and the second gate insulation film 12. The impurity concentration of the two P type layers are designed to provide a homogeneous threshold voltage adjustment throughout the ion-implanted layer 16.

With the manufacturing method of this invention, as described above, adjusting impurity concentrations in the region A and the region B can be made by two ion-implantation processes using only one mask, taking advantage of the difference in the thickness between the first gate insulation film 10A and the second gate insulation film 12. This leads to a manufacturing of a semiconductor device with homogeneous threshold voltages without relying on the two ion-implantation processes using two different masks as in the conventional art.

That is, with this invention, when the ions are implanted through the first and the second gate insulation films 10A and 12, respectively, in the first ion-implantation process, the boron ions implanted under the second gate insulation film 12 are offset by the phosphorous ions forming the second N type well region 2B for the normal voltage P channel type MOS transistor. The second N type well region 2B is formed in advance to have a higher impurity concentration than the first N type well region 2A for the high voltage P channel open drain MOS transistor. This results in the formation of P type layer for the threshold voltage adjustment only under the first gate insulation film 10A in the first ion-implantation process. The second ion-implantation is performed to form the P type layer for the threshold voltage adjustment under the second gate insulation film 12 under the ion-implantation conditions that the ions do not penetrate the first gate insulation film 10A. Accordingly, the two photoresist masks are not required as in the conventional art, and the manufacturing process steps and thus the manufacturing cost can be reduced. Furthermore, the second N type well region 2B is formed in the process to form the normal voltage P channel MOS transistor, thus requiring a change in the mask but no additional process steps.

Because the phosphorous ions in the second N type well region 2B to offset the boron ions mentioned above also exist in a region 17 near the source region in the first N type well region 2A as shown in FIG. 9, the impurity concentration in this portion is higher than that in the first N type well region 2A. Therefore, the depletion layer extending from the drain regions 9 and 19 is suppressed, resulting in size reduction of the transistor and, thus, a structure advantageous for fine patterning.

The ion-implantation for the threshold voltage adjustment is performed after the conductive film to form the gate electrode is formed on the gate insulation films 10A and 12, in this embodiment. However, this invention is not limited to that processing step order, and the ion-implantation for the threshold voltage adjustment can be performed after the gate insulation films 10A and 12 are formed and before the gate electrode is formed. In this case, ion-implantation conditions for the first and the second impurities are determined considering the thickness of each of the gate insulation films 10A and 12. Also in the case, in which the conductive films (the polysilicon film 13 and the tungsten silicide film 14) to form the electrode are formed on the gate insulation films 10A and 12, ion-implantation conditions for the first and the second impurities are determined considering the thickness of each of the films formed on each of the regions A and B, respectively.

Figure 10:
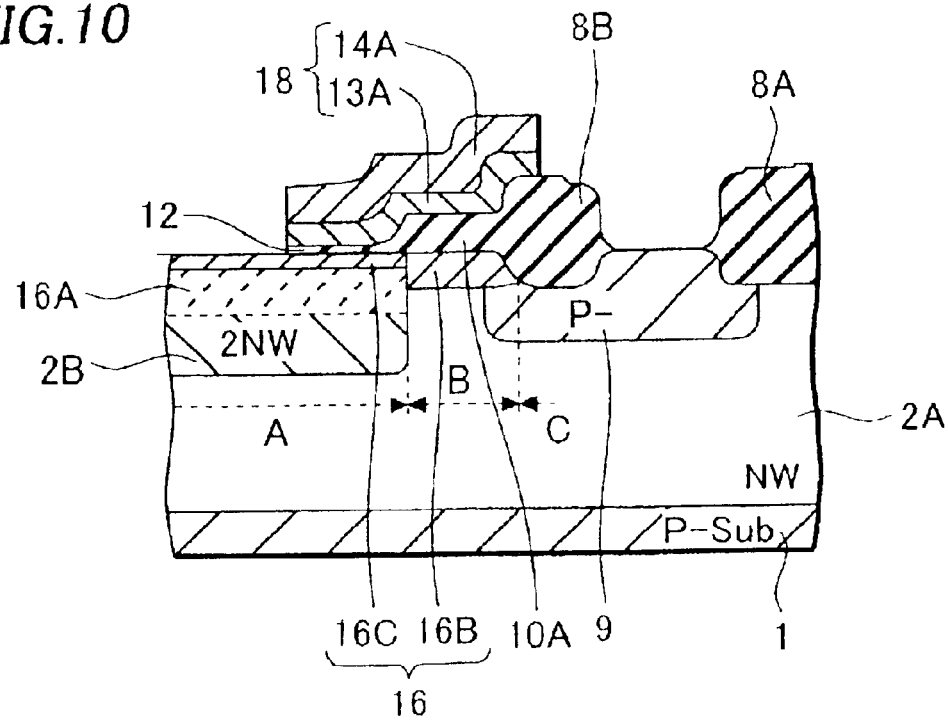
FIG. 10 is a cross-sectional view showing a device intermediate according to the manufacturing method of the semiconductor device of the embodiment of this invention.

Next, as shown in FIG. 10, the gate electrode 18, consisting of stacked layers of the tungsten silicide layer and the polysilicon layer, is formed by patterning the stacked layers using a photoresist film (not shown) as a mask.

Figure 11:
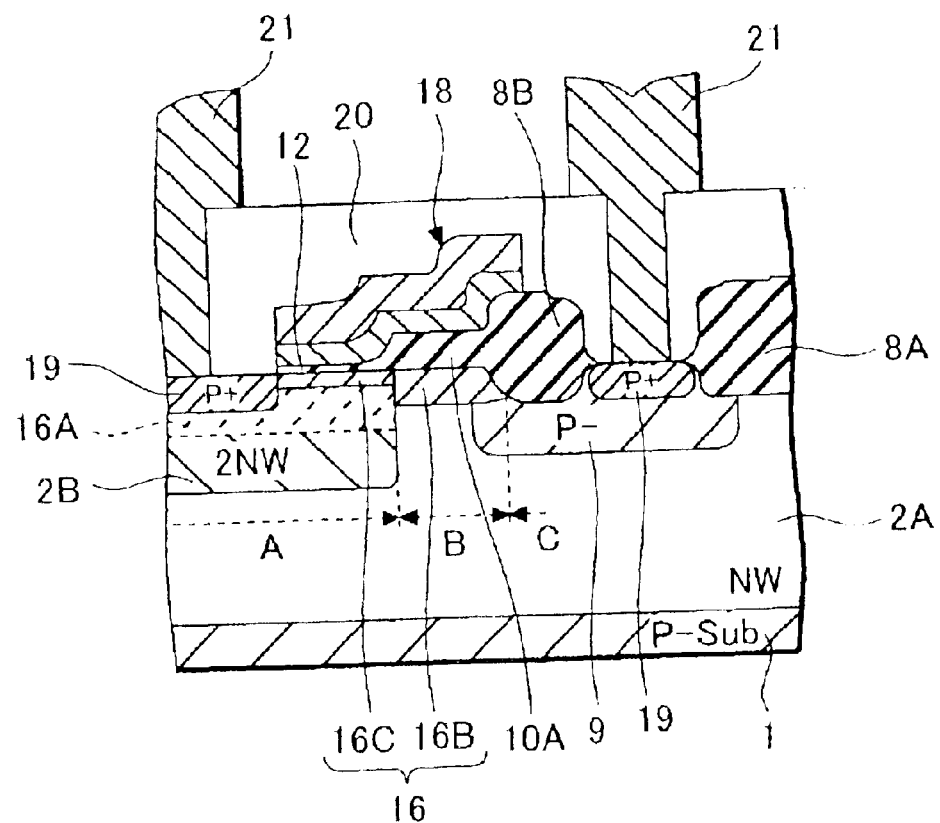
FIG. 11 is a cross-sectional view showing a device according to the manufacturing method of the semiconductor device of the embodiment of this invention.
Figure 12:
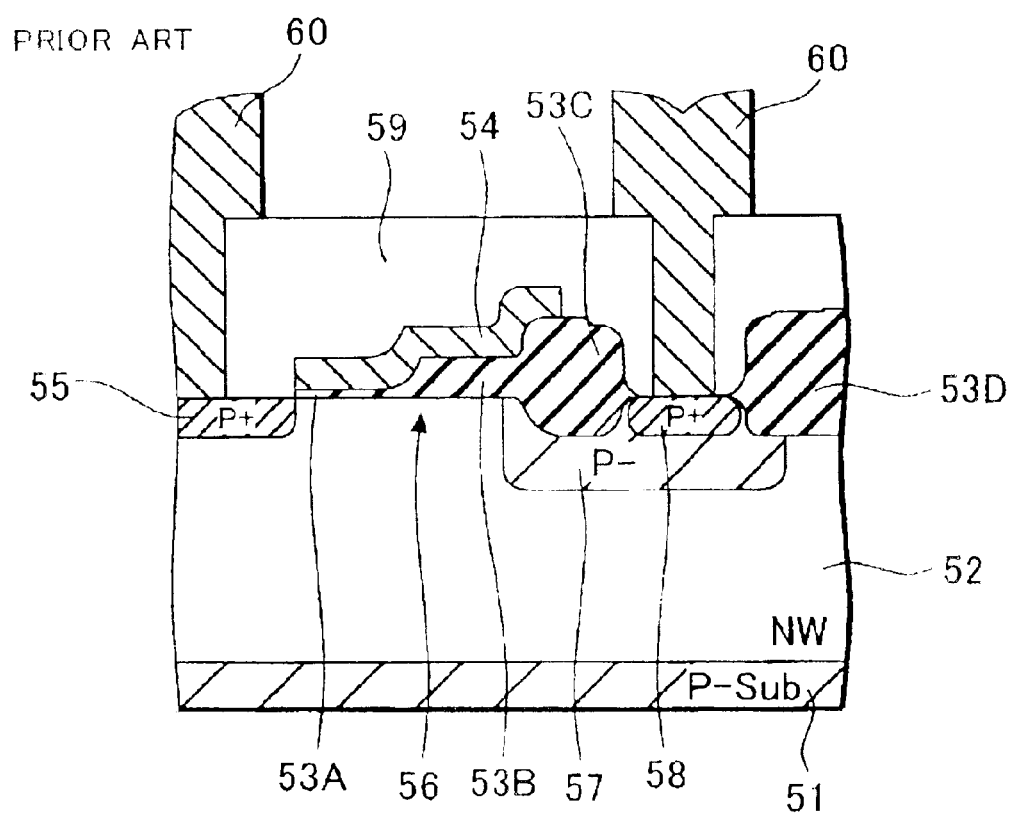
FIG. 12 is a cross-sectional view showing a conventional semiconductor device.
Figure 13:
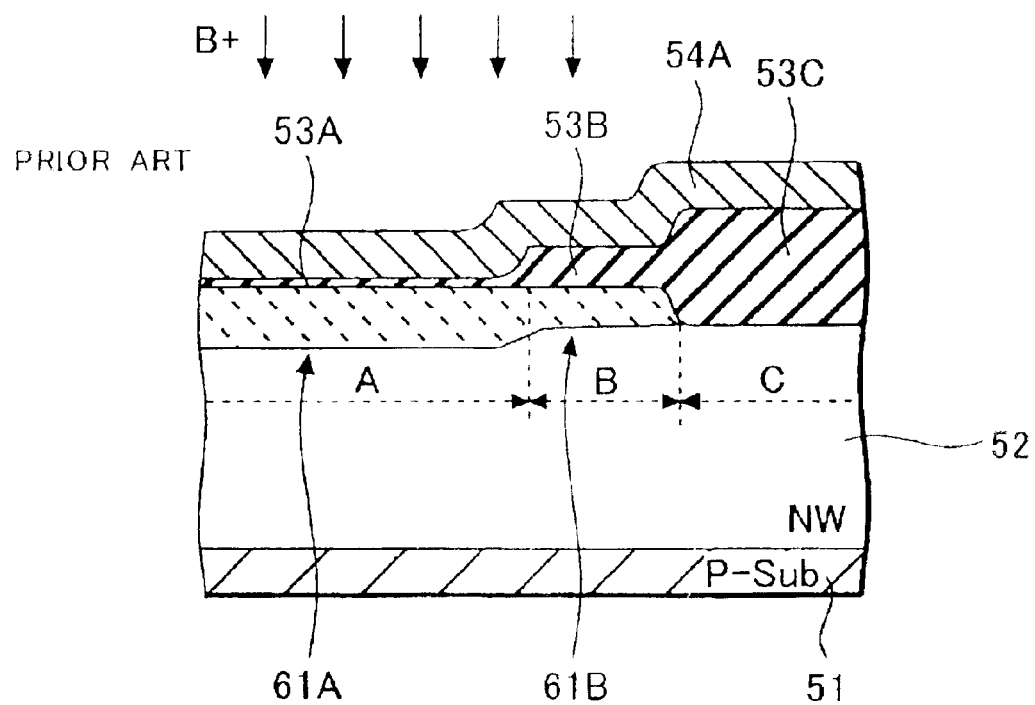
FIG. 13 is a cross-sectional view to show problems with the conventional semiconductor device.

Next as shown in FIG. 11, by implanting P type impurities, for example, $2 \times 10^{15}/cm^2$ of boron ions at an acceleration voltage of 20 KeV, using the element isolation film 8A, the selective insulation film 8B, the gate electrode 18 and a photoresist film (not shown) as a mask, a high impurity source region (P+ layer) 19 is formed adjacent one edge of the gate electrode 18 and a high impurity drain region (P+ layer) 19 is formed in the low impurity drain region (P− layer) 9 remote from the gate electrode 18 through the selective insulation film 8B.

Furthermore, an interlayer insulation film 20, which is a stacked layer of NSG (Non-Doped Silicate Glass) film and BPSG (Boro-Phospho Silicate Glass) film in this embodiment, is formed on the entire surface followed by a formation of a metal interconnect (Al film, Al—Si film Al—Cu film or Al—Si—Cu film, for example) 21, which contacts with the source and the drain regions 19 through contact holes formed in the interlayer insulation film 20.

Then, a passivation film (not shown) is formed on the entire surface completing the semiconductor device of this invention.

In this embodiment, as described above, the selective insulation film 8B made of the LOCOS insulation film is formed, and the thick gate insulation film 10A (the first gate insulation film) is formed adjacent the selective insulation film 8B, and a portion of the thick gate insulation film 10A is removed, and then the thin gate insulation film 12 (the second gate insulation film) is formed bordering on the thick gate insulation film 10A. The order to form each of the insulation films 8B, 10A and 12 is not limited to the order described above, but there are some variations.

That is, the order to form the selective insulation film and the gate insulation films can be reversed, the order to form two insulation films 10A and 12 consisting the gate insulation films can be reversed, the gate insulation film 8B can be formed between the formations of the two insulation films 10A and 12, and so on.

The embodiment shows an example in which this invention is applied to the high voltage P channel type open drain MOS transistor, but it is also applicable to a high voltage N channel type open drain MOS transistor.

For example, in the first ion-implantation process, N type impurities, for example phosphorous ions, are implanted through a first (thick) and a second (thin) gate insulation films. The phosphorous ions implanted under the second gate insulation film are offset by boron ions in a P type well region, which is formed in advance under the second gate insulation film to have higher impurity concentration than a P type substrate. With a second ion-implantation performed under conditions that N type impurities, for example phosphorous ions, penetrate the second gate insulation film but do not penetrate the first gate insulation film, an approximately homogeneous P type layer for the threshold voltage adjustment can be formed under the first and the second gate insulation films. The need for the two photoresist masks required in the conventional art is removed. Therefore the manufacturing process steps and thus the manufacturing cost can be reduced.

Also, because the boron ions in the P type well region to offset the phosphorous ions mentioned above exist in a region near the source region in the P type well region, the impurity concentration in this portion is higher than that in the P type substrate. Therefore, the depletion layer extending from the drain region is suppressed, resulting in the size reduction of the transistor and, thus, the structure advantageous for fine patterning.

In this embodiment explained above, the second N type well region 2B is formed under the thin gate insulation film 12 in advance, P type impurities (boron ions, for example) are implanted into the region A and the region B as shown in FIG. 8, the boron ions implanted in the region A are offset by the phosphorous ions forming the second N type well region 2B, and the boron ions are implanted into the region A anew, to enable adjusting the threshold voltage to a desired value without using two masks, taking advantage of the structure having gate insulation films 10A and 12 with the different thicknesses. It is also possible to adjust the threshold voltage to the desired value without using two masks, taking advantage of the structure having gate insulation films 10A and 12 with the different thicknesses, by implanting P type impurities (boron ions, for example) into the region A and the region B, and then implanting N type impurities (phosphorous ions, for example) only into the region A, so that the boron ions implanted deeper portion in the region A are offset (boron ions in shallower portion remain not being offset).

In the above-mentioned case, there may be an effect of the difference in the thickness between the gate insulation films. That is, there can be a case, depending on the difference in the thickness between the two, that the boron ions implanted deep into the substrate in the region A can not be offset by the phosphorous ions implanted with the second ion-implantation, since the first ion-implantation is performed under the conditions that the ions penetrate the thick gate insulation film (and the thin gate insulation film), while the second ion-implantation has to be performed under the conditions that the ions do not penetrate the thick gate insulation film although the ions penetrate the thin gate insulation film. With this invention, however, the problem mentioned above can be avoided by forming the second N type well deeper than the depth to which the boron ions are implanted with the first ion-implantation.

With this invention, the manufacturing process can be rationalized and the cost can be reduced, by taking advantage of the difference in the thickness between the gate insulation films in the process to form the ion-implantation layers for the threshold voltage adjustment of a semiconductor device having gate insulation films with different thicknesses.

When the impurity ions of the opposite conductivity type to a semiconductor layer are implanted into the semiconductor layer so that the impurities penetrate the gate insulation films of the different thicknesses, the impurities implanted under the thin gate insulation film are offset by the well region formed under the thin gate insulation film having higher concentration of the impurities of the same conductivity type than the semiconductor layer. Therefore, the depletion layer extending from the drain region can be suppressed, resulting in the size reduction of the transistor.

What is claimed is:

1. A manufacturing method of a semiconductor device comprising:
   providing a semiconductor substrate of a first conductivity type;
   forming a first well region of a second conductivity type in the semiconductor substrate;
   forming a second well region of the second conductivity type having an impurity concentration higher than an impurity concentration of the first well region;
   forming a first gate insulation film on the first well region;
   forming a second gate insulation film thinner than the first gate insulation film on the second well region;
   ion-implanting first impurity ions of the first conductivity type into the substrate so that the first impurity ions reach the first and second well regions through the first and second gate insulating films; and
   ion-implanting second impurity ions of the first conductivity type into the substrate so that the second impurity ions reach the second well region through the second gate insulating film and do not reach the first well region through the first gate insulating film.

2. The manufacturing method of a semiconductor device of claim 1, wherein impurity ions of the second well regions of the second conductivity type are configured to offset the first impurity ions of the first conductivity type.

3. The manufacturing method of a semiconductor device of claim 1, wherein the second gate insulation film is formed after the first gate insulation film is formed.

4. The manufacturing method of a semiconductor device of claim 1, wherein the second gate insulation film is formed before the first gate insulation film is formed.

5. The manufacturing method of a semiconductor device of claim 1, wherein the first impurity ion and the second impurity ion are the same impurity ion.

6. A manufacturing method of a semiconductor device comprising:

providing a semiconductor substrate;

forming a selective insulation film on a predetermined region of the semiconductor substrate by selectively oxidizing the semiconductor substrate using an oxidation resistant film as a first mask;

forming a first gate insulation film adjacent the selective insulation film by thermally oxidizing the semiconductor substrate after removing the oxidation resistant film;

removing a portion of the first gate insulation film;

forming a second gate insulation film thinner than the first gate insulation film at a portion of the semiconductor substrate adjacent the remaining first gate insulation film by thermally oxidizing the semiconductor substrate;

ion-implanting first impurities into the substrate so that the first impurities penetrate through the first and second gate insulation films; and ion-implanting second impurities into the substrate so that the second impurities penetrate through the second gate insulation film but do not penetrate through the first gate insulation film;

forming a gate electrode across the second gate insulation film, the first gate insulation film and the selective insulation film;

forming a source region adjacent the gate electrode through the second gate insulation film; and forming a drain region adjacent the gate electrode through the selective insulation film.

7. The manufacturing method of a semiconductor device of claim 1, wherein the ion-implanting of the first impurity ions is performed using a mask, and the ion-implanting of the second impurity ions is performed using the mask.

8. The manufacturing method of a semiconductor device of claim 6, wherein the ion-implanting of the first impurities is performed using a second mask, and the ion-implanting of the second impurity ions is performed using the second mask.

* * * * *